United States Patent
Inazu et al.

(10) Patent No.: US 11,302,845 B2
(45) Date of Patent: Apr. 12, 2022

(54) SEMICONDUCTOR LIGHT-EMITTING ELEMENT

(71) Applicant: NIKKISO CO., LTD., Tokyo (JP)

(72) Inventors: Tetsuhiko Inazu, Hakusan (JP); Cyril Pernot, Hakusan (JP)

(73) Assignee: NIKKISO CO., LTD., Tokyo (JP)

( * ) Notice: Subject to any disclaimer, the term of this patent is extended or adjusted under 35 U.S.C. 154(b) by 18 days.

(21) Appl. No.: 16/773,348

(22) Filed: Jan. 27, 2020

(65) Prior Publication Data

US 2020/0161505 A1  May 21, 2020

Related U.S. Application Data

(63) Continuation of application No. PCT/JP2018/023129, filed on Jun. 18, 2018.

(30) Foreign Application Priority Data

Jul. 27, 2017  (JP) .............................. JP2017-145592

(51) Int. Cl.
  *H01L 33/32* (2010.01)
  *H01L 33/06* (2010.01)
  *H01L 33/50* (2010.01)

(52) U.S. Cl.
  CPC .............. *H01L 33/32* (2013.01); *H01L 33/06* (2013.01); *H01L 33/50* (2013.01)

(58) Field of Classification Search
  CPC combination set(s) only.
  See application file for complete search history.

(56) References Cited

U.S. PATENT DOCUMENTS

| 9,153,741 B1 | 10/2015 | Hirayama et al. |
| 2007/0008539 A1 | 1/2007 | Hirano et al. |
| 2008/0281385 A1 | 11/2008 | Inada et al. |

(Continued)

FOREIGN PATENT DOCUMENTS

| JP | H07115114 A | 5/1995 |
| JP | H08133964 A | 5/1996 |

(Continued)

OTHER PUBLICATIONS

International Search Report for the Corresponding PCT Application No. PCT/JP2018/023129 With English Translation and the Cited Reference(s) With an English Abstract; dated Jun. 27, 2018.

(Continued)

*Primary Examiner* — Kyoung Lee
*Assistant Examiner* — Christina A Sylvia
(74) *Attorney, Agent, or Firm* — Muncy, Geissler, Olds & Lowe, P.C.

(57) ABSTRACT

A semiconductor light-emitting element includes: an n-type clad layer of an n-type aluminum gallium nitride (AlGaN)-based semiconductor material provided on a substrate; an active layer of an AlGaN-based semiconductor material provided on the n-type clad layer and configured to emit deep ultraviolet light having a wavelength of not shorter than 300 nm and not longer than 360 nm; and a p-type semiconductor layer provided on the active layer. The n-type clad layer is configured such that a transmittance for deep ultraviolet light having a wavelength of 300 nm or shorter is 10% or lower.

6 Claims, 2 Drawing Sheets

(56) References Cited

U.S. PATENT DOCUMENTS

| | | | |
|---|---|---|---|
| 2009/0283746 A1 | 11/2009 | Chua et al. | |
| 2014/0103289 A1* | 4/2014 | Liao | H01L 21/0254 257/13 |
| 2014/0327034 A1 | 11/2014 | Toyota | |
| 2015/0041755 A1* | 2/2015 | Zhang | H01L 33/06 257/13 |
| 2015/0126018 A1* | 5/2015 | Sato | C30B 25/02 438/478 |
| 2015/0311392 A1* | 10/2015 | Hirayama | H01L 33/32 257/13 |
| 2018/0166604 A1 | 6/2018 | Fujita et al. | |
| 2018/0277714 A1* | 9/2018 | Furusawa | H01L 33/32 |
| 2018/0331250 A1* | 11/2018 | Hirayama | H01L 33/0075 |
| 2019/0081203 A1 | 3/2019 | Fujita et al. | |
| 2019/0140137 A1* | 5/2019 | Kim | H01L 33/04 |

FOREIGN PATENT DOCUMENTS

| | | |
|---|---|---|
| JP | 2002033080 A | 1/2002 |
| JP | 2002124737 A | 4/2002 |
| JP | 2004296458 A | 10/2004 |
| JP | 2007151807 A | 6/2007 |
| JP | 2007227494 A | 9/2007 |
| JP | 2008073148 A | 4/2008 |
| JP | 2009278088 A | 11/2009 |
| JP | 2013105917 A | 5/2013 |
| JP | 2015216352 A | 12/2015 |
| JP | 2016111370 A | 6/2016 |
| JP | 2016213448 A | 12/2016 |
| WO | WO2005106979 A1 | 11/2005 |
| WO | WO2017029923 A1 | 2/2017 |

OTHER PUBLICATIONS

Written Opinion of ISA With an English Translation; dated Jul. 10, 2018.
Written Opinion of IPEA With an English Translation and the Cited Reference(s) With an English Abstract; dated Jul. 16, 2019.
International Preliminary Examination Report on Patentability (II) With an English Translation; dated May 13, 2019; dated May 13, 2019.
Office Action dated Mar. 20, 2019 for the Corresponding Japanese Patent Application No. 2017-145592 With English Translation.
Office Action dated Jul. 17, 2019 for the Corresponding Japanese Patent Application No. 2017-145592 With English Translation.
Office Action dated Mar. 7, 2019 for the Corresponding Taiwanese Patent Application No. 107123133.

* cited by examiner

SEMICONDUCTOR LIGHT-EMITTING ELEMENT

RELATED APPLICATION

Cross Reference to Related Applications

This application is a Continuation of co-pending Application No. PCT/JP2018/023129, filed on Jun. 18, 2018, for which priority is claimed under 35 U.S.C. § 120; and this application claims priority of Application No. 2017-145592 filed in Japan on Jul. 27, 2017 under 35 U.S.C. § 119; and this application claims priority, the entire contents of all of which are hereby incorporated by reference.

BACKGROUND OF THE INVENTION

1. Field of the Invention

The present invention relates to semiconductor light-emitting elements.

2. Description of the Related Art

Recently, efforts have been made to develop semiconductor light-emitting elements capable of emitting deep ultraviolet light. A light-emitting element for emitting deep ultraviolet light includes an aluminum gallium nitride (AlGaN) based n-type clad layer, active layer, and p-type clad layer, etc. stacked successively on an aluminum nitride (AlN) layer. For example, an n-type clad layer having an AlN molar fraction in excess of 50% is used to realize an emission wavelength of 300 nm or shorter.

Ultraviolet treatment is used to treat certain skin diseases. Major equipment used in ultraviolet treatment includes UVA irradiation devices, UVB irradiation devices, narrow-band UVB (NB-UVB) irradiation devices and the like, each of which uses a fluorescent lamp as a light source. Ultraviolet light of 308 nm has received attention as having high therapeutic effect. A Xenon chloride (XeCl) excimer discharge lamp (so-called excimer light) is used as a light source capable of outputting the wavelength of 308 nm.

In ultraviolet treatment, it is said to be preferable to use ultraviolet light having a wavelength of 300 nm or longer. It is known that ultraviolet light near 308-311 nm is particularly useful in treatment. Meanwhile, it is preferred not to irradiate a subject of treatment with ultraviolet light having a wavelength of shorter than 300 nm, which is said to have a serious negative impact of irradiation.

SUMMARY OF THE INVENTION

The present invention addresses the above-described issue, and an illustrative purpose thereof is to provide a semiconductor light-emitting element capable of outputting ultraviolet light suitable for ultraviolet treatment.

A semiconductor light-emitting element according to an embodiment of the present invention includes: an n-type clad layer of an n-type aluminum gallium nitride (AlGaN)-based semiconductor material provided on a substrate; an active layer of an AlGaN-based semiconductor material provided on the n-type clad layer and configured to emit deep ultraviolet light having a wavelength of not shorter than 300 nm and not longer than 360 nm; and a p-type semiconductor layer provided on the active layer. The n-type clad layer is configured such that a transmittance for deep ultraviolet light having a wavelength of 300 nm or shorter is 10% or lower.

According to this embodiment, deep ultraviolet light having a wavelength of 300 nm or longer suitable for ultraviolet treatment is output, and, at the same time, components of the output light having a wavelength shorter than 300 nm not suitable for irradiation treatment are attenuated by the n-type clad layer. Accordingly, ultraviolet light suitable for ultraviolet treatment is provided without providing an extra wavelength filter for cutting ultraviolet light having a wavelength shorter than 300 nm.

The n-type clad layer may be configured such that a transmittance for a peak wavelength of deep ultraviolet light emitted by the active layer is 70% or higher.

The active layer may have a quantum well structure including one or more well layers of an AlGaN-based semiconductor material and one or more barrier layers of an AlGaN-based semiconductor material having a higher AlN molar fraction than the well layer, A difference between the AlN composition ratio of the n-type clad layer and the AlN composition ratio of the well layer may be 10% or less.

The AlN molar fraction in the well layer may be not more than 30%, and the AlN molar fraction in the n-type clad layer may be not more than 40%.

The peak wavelength of the deep ultraviolet light emitted by the active layer may be not shorter than 305 nm and not longer than 315 nm.

The semiconductor light-emitting element may further include: a base layer of AlN provided on the substrate, and a buffer layer of an AlGaN-based semiconductor material provided between the base layer and the n-type clad layer and having an AlN molar fraction of not less than 40% and less than 60%.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Figure 1:
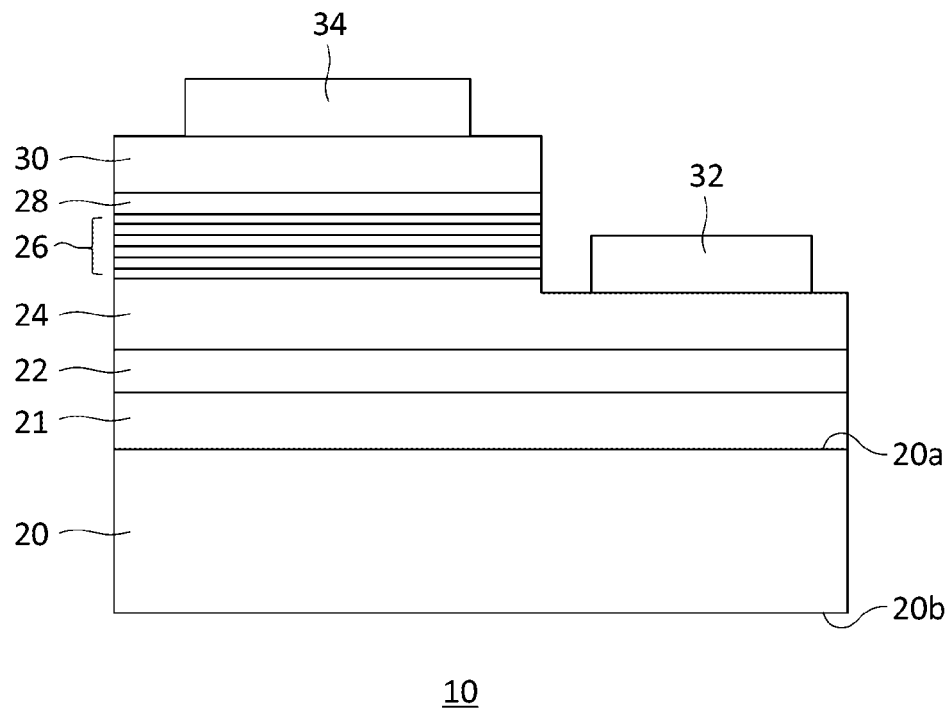
FIG. 1 is a cross-sectional view schematically showing a configuration of a semiconductor light-emitting element according to the embodiment.

The invention will now be described by reference to the preferred embodiments. This does not intend to limit the scope of the present invention, but to exemplify the invention.

A detailed description will be given of embodiments to practice the present invention with reference to the drawings. The same numerals are used in the description to denote the same elements and a duplicate description is omitted as appropriate. To facilitate the understanding, the relative dimensions of the constituting elements in the drawings do not necessarily mirror the relative dimensions in the actual light-emitting element.

FIG. 1 is a cross-sectional view schematically showing a configuration of a semiconductor light-emitting element 10 according to an embodiment. The semiconductor light-emitting element 10 is a light emitting diode (LED) chip configured to emit "deep ultraviolet light" having a central wavelength λ of about 360 nm or shorter. To output deep ultraviolet light having such a wavelength, the semiconductor light-emitting element 10 is made of an aluminum gallium nitride (AlGaN)-based semiconductor material having a band gap of about 3.4 eV or larger.

The semiconductor light-emitting element 10 according to the embodiment is configured to emit deep ultraviolet light having a peak wavelength of not shorter than 305 nm and not longer than 315 nm and outputs ultraviolet light in a waveband suitable for ultraviolet treatment. In particular, the element outputs ultraviolet light having a wavelength of 311 nm±2 nm, referred to as narrow-band UVB, or ultraviolet light having a wavelength of 308 nm-311 nm, which has received attention as having high therapeutic effect. Meanwhile, the semiconductor light-emitting element 10 is configured to output ultraviolet light with a low intensity in a waveband shorter than the wavelength of 300 nm not suitable for ultraviolet treatment.

In this specification, the term "AlGaN-based semiconductor material" refers to a semiconductor material mainly containing aluminum nitride (AlN) and gallium nitride (GaN) and shall encompass a semiconductor material containing other materials such as indium nitride (InN). Therefore, "AlGaN-based semiconductor materials" as recited in this specification can be represented by a composition $In_{1-x-y}Al_xGa_yN$ ($0 \leq x+y \leq 1$, $0 \leq x \leq 1$, $0 \leq y \leq 1$). The AlGaN-based semiconductor material shall contain AlN, GaN, AlGaN, indium aluminum nitride (InAlN), indium gallium nitride (InGaN), or indium aluminum gallium nitride (InAlGaN).

Of "AlGaN-based semiconductor materials", those materials that do not substantially contain AlN may be distinguished by referring to them as "GaN-based semiconductor materials". "GaN-based semiconductor materials" mainly contain GaN or InGaN and encompass materials that additionally contain a slight amount of AlN. Similarly, of "AlGaN-based semiconductor materials", those materials that do not substantially contain GaN may be distinguished by referring to them as "AlN-based semiconductor materials". "AlN-based semiconductor materials" mainly contain AlN or InAlN and encompass materials that additionally contain a slight amount of GaN.

The semiconductor light-emitting element 10 includes a substrate 20, a base layer 21, a buffer layer 22, an n-type clad layer 24, an active layer 26, an electron block layer 28, a p-type clad layer 30, an n-side electrode 32, and a p-side electrode 34.

The substrate 20 is a substrate having translucency for the deep ultraviolet light emitted by the semiconductor light-emitting element 10 and is, for example, a sapphire ($Al_2O_3$) substrate. The substrate 20 includes a first principal surface 20a and a second principal surface 20b opposite to the first principal surface 20a. The first principal surface 20a is a principal surface that is a crystal growth surface for growing the base layer 21 and the layers above. The second principal surface 20b is a principal surface that is a light extraction surface for extracting the deep ultraviolet light emitted by the active layer 26 outside. The substrate 20 may be an aluminum nitride (AlN) substrate in one variation.

The base layer 21 is formed on the first principal surface 20a of the substrate 20. The base layer 21 is a foundation layer (template layer) to form the buffer layer 22 and the layers above. For example, the base layer 21 is an undoped AlN layer and is, specifically, an AlN (HT-AlN; High Temperature AlN) layer gown at a high temperature. In the case the substrate 20 is an AlN substrate, the base layer 21 may be an AlGaN layer having a high (e.g., 80% or higher) AlN composition ratio. In the case the substrate 20 is an AlN substrate, the base layer 21 may not be provided.

The buffer layer 22 is an AlGaN-based semiconductor material layer formed on the base layer 21. The buffer layer 22 may be an undoped AlGaN layer or an n-type AlGaN layer doped with silicon (Si) as an n-type impurity. It is preferable that the AlN molar fraction in the buffer layer 22 be not less than 40% and less than 60% and, preferably, about 45%-55%. The thickness of the buffer layer 22 is about 0.1 μm-3 μm and, for example, about 1 μm-2 μm. The buffer layer 22 may not be provided.

The n-type clad layer 24 is formed on the buffer layer 22. The n-type clad layer 24 is an n-type AlGaN-based semiconductor material layer. The composition ratio and the thickness of the n-type clad layer 24 are selected such that the transmittance for the peak wavelength of the deep ultraviolet light emitted by the active layer 26 is 70% or higher, and the transmittance for the ultraviolet light of 300 nm or shorter is 10% or lower. The n-type clad layer 24 is configured such that the AlN molar fraction is not less than 30% and not more than 40%. For example, the AlN molar fraction is configured to be not less than 34% and not more than 38%. The thickness of the n-type clad layer 24 is about 0.1 μm-5 μm and, for example, about 0.5 μm-3 μm.

Comparing the buffer layer 22 and the n-type clad layer 24, the molar fraction of AlN in the n-type clad layer 24 is configured to be lower than that of the buffer layer 22. Conversely, the AlN molar fraction in the buffer layer 22 is configured to be higher than that of the n-type clad layer 24. The difference in grating constant between the base layer 21 and the buffer layer 22, which are made of AlN or AlGaN with a high AlN composition ratio, can be moderated by increasing the AlN molar fraction in the buffer layer 22.

In order to increase the crystal quality of the n-type clad layer 24, it is preferred that the difference in AlN composition between the buffer layer 22 and the n-type clad layer 24 is as small as possible. It is preferred that the difference in AlN molar fraction between the buffer layer 22 and the n-type clad layer 24 be not less than 5% and not more than 25% and, for example, not less than 10% and not more than 20%.

The active layer 26 is made of an AlGaN-based semiconductor material and has a double heterojunction structure by being sandwiched between the n-type clad layer 24 and the electron block layer 28. The active layer 26 may have a monolayer or multilayer quantum well structure. For example, the active layer 26 may be formed by stack of a barrier layer made of an undoped AlGaN-based semiconductor material and a well layer made of an undoped AlGaN-based semiconductor material. To output deep ultraviolet light having a wavelength of 355 nm or shorter, the active layer 26 is formed to have a band gap of 3.4 eV or larger. For example, the AlN composition ratio of the active layer 26 is selected so as to output deep ultraviolet light having a peak wavelength of not shorter than 305 nm and not longer than 315 nm. For example, the AlN composition ratio of the well layer is configured to be not less than 25% and not more than 35%, and the AlN composition ratio of the barrier layer is configured to be not less than 45% and not more than 55%. Further, the AlN composition ratio of the well layer is configured such that the difference in AlN composition ratio from the n-type clad layer 24 is 10% or less.

The electron block layer 28 is formed on the active layer 26. The electron block layer 28 is an undoped or p-type AlGaN-based semiconductor material layer and is formed such that the molar fraction of AlN is 40% or higher, and, preferably, 50% or higher. The electron block layer 28 may be formed such that the molar fraction of AlN is 80% or higher, or may be made of an AlN-based semiconductor material that does not substantially contain GaN. The electron block layer has a thickness of about 0.1 nm-10 nm. For example, the electron block layer has a thickness of about 1 nm-5 nm.

The p-type clad layer 30 is a p-type semiconductor layer formed on the electron block layer 28. The p-type clad layer 30 is a p-type AlGaN-based semiconductor material layer. For example, the p-type clad layer 30 is an AlGaN layer doped with magnesium (Mg) as a p-type impurity. The p-type clad layer 30 has a thickness of about 300 nm-700 nm. For example, the p-type clad layer 30 has a thickness of about 400 nm-600 nm. The p-type clad layer 30 may be made of a p-type GaN-based semiconductor material that does not substantially contain AlN.

The n-side electrode 32 is formed in a partial region on the n-type clad layer 24. The n-side electrode 32 is formed by a multilayer film in which titanium (Ti)/aluminum (Al)/Ti/ gold (Au) are stacked on the n-type clad layer 24 successively. The n-side electrode 32 may be provided on the buffer layer 22 exposed by removing the partial region of the n-type clad layer 24. The p-side electrode 34 is formed on the p-type clad layer 30. The p-side electrode 34 is formed by a nickel (Ni)/gold (Au) multilayer film built on the p-type clad layer 30 successively.

Figure 2:
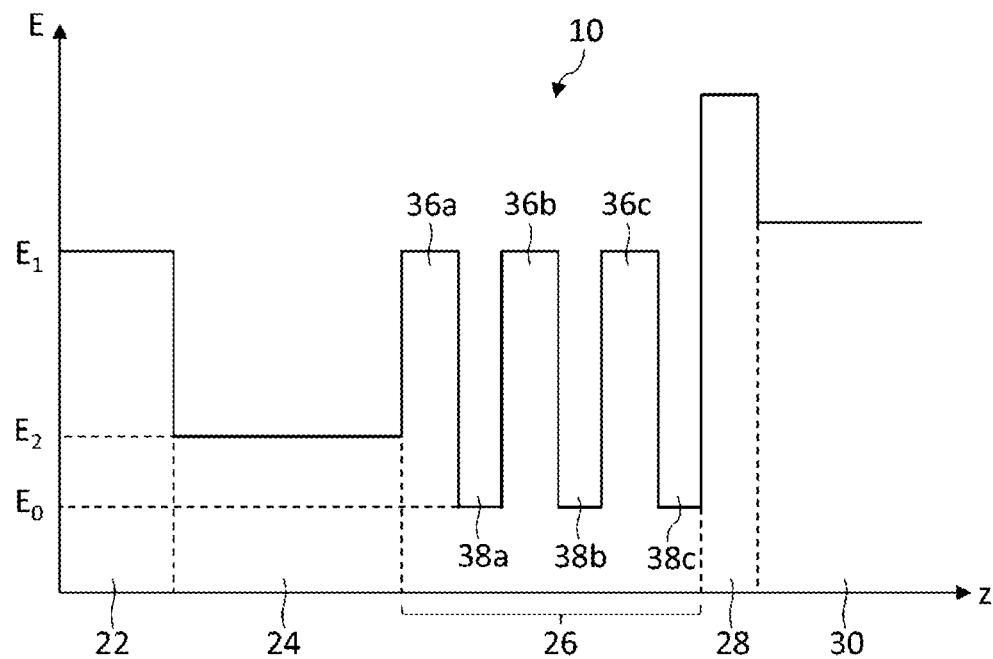
FIG. 2 schematically shows an energy band of the semiconductor light-emitting element.

FIG. 2 schematically shows an energy band of the semiconductor light-emitting element 10 and, in particular, schematically shows the ground level of the conductive band near the active layer 26. FIG. 2 shows a case in which the active layer 26 is comprised of a multiple quantum well structure in which three barrier layers 36a, 36b, and 36c (generically referred to as barrier layers 36) and three well layers 38a, 38b, and 38c (generically referred to as well layers 38) are alternately stacked. The structure of the active layer 26 may not be limited to a three-layer quantum well structure but may be a single-layer quantum well structure, or a quantum well structure of two or four layers or more.

As shown in FIG. 2, the ground level $E_0$ of the well layer 38 is lowest, and the ground level $E_2$ of the n-type clad layer 24 is higher than the ground level $E_0$ of the well layer 38. The ground level $E_1$ of the buffer layer 22 is higher than the ground level $E_2$ of the n-type clad layer 24. The ground level of the barrier layer 36 is higher than the ground level $E_2$ of the n-type clad layer 24 and is similar to the ground level $E_1$ of the buffer layer 22. The ground level of the barrier layer 36 may be higher or lower than the ground level $E_1$ of the buffer layer 22.

Figure 3:
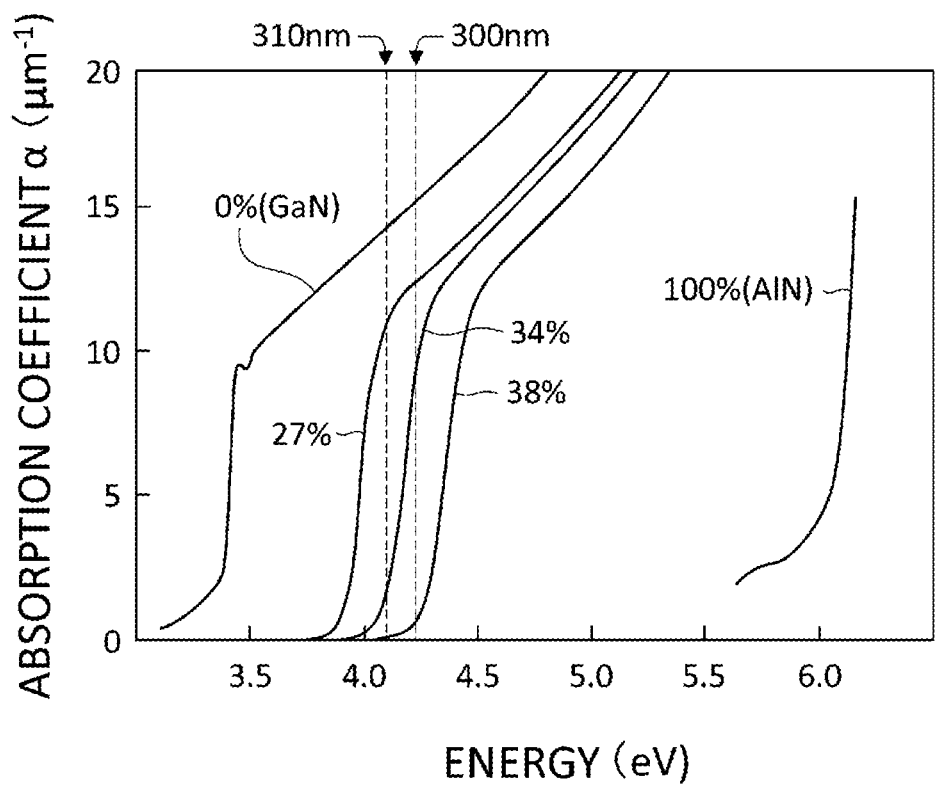
FIG. 3 is a graph showing the light absorption property of an AlGaN-based semiconductor material.

FIG. 3 is a graph showing the light absorption property of an AlGaN-based semiconductor material and shows the light absorption property occurring when the AlN molar fraction is 0%, 27%, 34%, 38%, and 100%. The original data for the graph are presented in J. F. Muth et al., MRS Internet Journal of Nitride Semiconductor Research Res. 4S1, G5.2 (1999). Broken lines indicating the energy positions corresponding to the wavelengths of 300 nm and 310 nm are added to the original graph. The graph reveals that an increase in the AlN molar fraction in AlGaN results in a larger band energy gap and movement of the curve of light absorption property toward the high-energy side (right side on the paper). The graph also reveals that it is possible to induce a large difference between the absorption coefficient α for the wavelength of 300 nm and that of the wavelength of 310 nm. The transmittance T of the n-type clad layer 24 is found by using the absorption coefficient α shown in the graph and the thickness t of the n-type clad layer 24 and according to an expression $T=\exp(-\alpha t)$.

For example, given that the AlN molar fraction is 34%, the absorption coefficient for the wavelength of 300 nm is about 10 $\mu m^{-1}$, and the absorption coefficient for the wavelength of 310 nm is about 1.5 $\mu m^{-1}$. In this case, the transmittance for the wavelength of 300 nm is controlled to be 10% or lower, and, at the same time, the transmittance for the wavelength of 310 nm is controlled to be 70% or higher, by configuring the thickness to be about 0.24 mm. Further, given that the AlN molar fraction is 38%, the absorption coefficient for the wavelength of 300 nm is about 0.7 $\mu m^{-1}$, and the absorption coefficient for the wavelength of 310 nm is about 0.1 $\mu m^{-1}$. In this case, the transmittance for the wavelength of 300 nm is controlled to be 10% or lower, and, at the same time, the transmittance for the wavelength of 310 nm is controlled to be 70% or higher, by configuring the thickness to be about 3.3 $\mu m$. Further, the transmittance for the wavelength of 300 nm is controlled to be 10% or lower, and, at the same time, the transmittance for the wavelength of 310 nm is controlled to be 70% or higher, by configuring the AlN molar fraction to be about 36% and configuring the thickness to be about 1-3 $\mu m$. In this way, it is ensured that 70% or more of the ultraviolet light near the wavelength of 310 nm is transmitted, and the transmittance for the ultraviolet light of the wavelength of 300 nm or shorter is configured to be 10% or lower, by suitably setting the AlN molar fraction and the thickness of the n-type clad layer 24. In the case the peak wavelength is not 310 nm, the AlN composition ratio and the thickness of the n-type clad layer 24 may be adjusted as appropriate so that the transmittance for the desired peak wavelength is 70% or higher, and the transmittance for the wavelength of 300 nm is 10% or lower.

Figure 4:
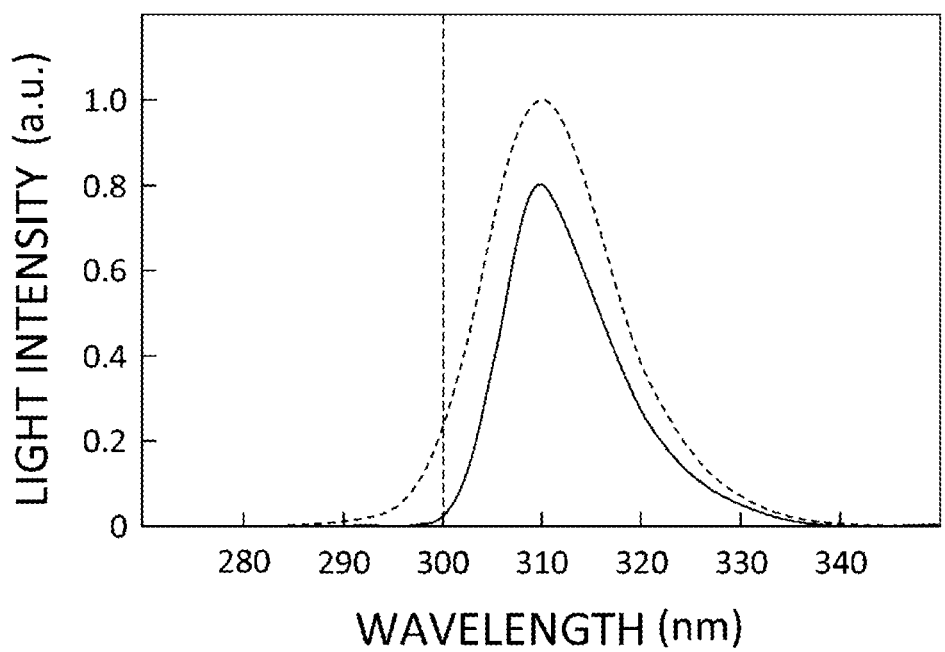
FIG. 4 is a graph schematically showing the wavelength characteristics of the light output of the semiconductor light-emitting element.

FIG. 4 is a graph schematically showing the wavelength characteristics of the light output of the semiconductor light-emitting element 10. The solid line in the graph shows a case in which the n-type clad layer 24 configured as described above is provided. Meanwhile, the broken line in the graph shows a case in which the AlN composition ratio is configured to be higher than that of the n-type clad layer 24 described above to substantially prevent the output of the active layer 26 from being absorbed by the n-type clad layer. The graph shows that the embodiment prevents the light output at the peak wavelength (e.g., 310 nm) of the semiconductor light-emitting element 10 from dropping significantly and, at the same time, reduces the light output at the wavelength shorter than 300 nm drastically. This allows components of the wavelength shorter than 300 nm, which have a serious negative impact of irradiation on human beings and animals, to be cut by the n-type clad layer 24 and provides highly safe ultraviolet light suitable for ultraviolet treatment.

Described above is an explanation based on an exemplary embodiment. The embodiment is intended to be illustrative only and it will be understood by those skilled in the art that various design changes are possible and various modifications are possible and that such modifications are also within the scope of the present invention.

In the embodiment described above, it is shown that the peak wavelength of the active layer 26 is in the range of 305 nm-315 nm. In one variation, the active layer 26 may be configured to output ultraviolet light of a wavelength of 320 nm or longer or may be configured to be suited to the provision of long-wavelength ultraviolet light (UVA wave) of 320 nm-400 nm. In this case, an irradiation device suitable for UVA irradiation may be configured by combining an AlGaN-based light-emitting element outputting a wavelength of 320 nm-360 nm and a GaN-based light-emitting element outputting a wavelength of 360 nm-400 nm.

It should be understood that the invention is not limited to the above-described embodiment but may be modified into various forms on the basis of the spirit of the invention. Additionally, the modifications are included in the scope of the invention.

What is claimed is:

1. A semiconductor light-emitting element comprising:
    an n-type clad layer of an n-type aluminum gallium nitride (AlGaN)-based semiconductor material provided on a substrate;
    an active layer of an AlGaN-based semiconductor material provided on the n-type clad layer and configured to emit deep ultraviolet light having a peak wavelength of not shorter than 305 nm and not longer than 315 nm; and
    a p-type semiconductor layer provided on the active layer, wherein
    the active layer has a quantum well structure including one or more well layers of an AlGaN-based semiconductor material and one or more barrier layers of an AlGaN-based semiconductor material,
    an AlN composition ratio of the barrier layers is higher than an AlN composition ratio of the well layers,
    an AlN composition ratio of the n-type clad layer is higher than the AlN composition ratio of the well layers, and
    a difference between the AlN composition ratio of the n-type clad layer and the AlN composition ratio of the well layers is 10% or less, and
    the n-type clad layer is configured such that a transmittance for ultraviolet light having a wavelength of 310 nm is 70% or higher, and a transmittance for deep ultraviolet light having a wavelength of 300 nm and shorter is 10% or lower.

2. The semiconductor light-emitting element according to claim 1, wherein
    the n-type clad layer is made of an AlGaN-based semiconductor material having an AlN composition ratio of not less than 34% and not more than 38%.

3. The semiconductor light-emitting element according to claim 2, wherein
    a thickness of the n-type clad layer is not less than 0.24 µm and not more than 3.3 µm.

4. The semiconductor light-emitting element according to claim 1, wherein
    the AlN composition ratio of the well layers is not less than 25% and not more than 35%, and the AlN composition ratio of the barrier layers is not less than 45% and not more than 55%.

5. The semiconductor light-emitting element according to claim 1, further comprising:
    a base layer of AlN provided on the substrate, and a buffer layer of an AlGaN-based semiconductor material provided between the base layer and the n-type clad layer, and
    an AlN composition ratio of the buffer layer is not less than 40% and less than 60%.

6. The semiconductor light-emitting element according to claim 1, wherein
    the AlN composition ratio of the barrier layers is higher than the AlN composition ratio of the n-type clad layer.

* * * * *